United States Patent
Cho et al.

(10) Patent No.: US 9,911,720 B1
(45) Date of Patent: Mar. 6, 2018

(54) POWER SWITCH PACKAGING WITH PRE-FORMED ELECTRICAL CONNECTIONS FOR CONNECTING INDUCTOR TO ONE OR MORE TRANSISTORS

(71) Applicant: Infineon Technologies Americas Corp., El Segundo, CA (US)

(72) Inventors: Eung San Cho, Torrance, CA (US); Danny Clavette, Greene, RI (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 15/241,981

(22) Filed: Aug. 19, 2016

(51) Int. Cl.
| | |
|---|---|
| H01L 27/08 | (2006.01) |
| H01L 25/16 | (2006.01) |
| H01L 21/683 | (2006.01) |
| H01L 23/498 | (2006.01) |
| H01L 21/48 | (2006.01) |
| H01L 21/56 | (2006.01) |
| H01L 23/00 | (2006.01) |

(52) U.S. Cl.
CPC .......... *H01L 25/16* (2013.01); *H01L 21/486* (2013.01); *H01L 21/563* (2013.01); *H01L 21/6835* (2013.01); *H01L 23/49805* (2013.01); *H01L 23/49811* (2013.01); *H01L 24/29* (2013.01); *H01L 2221/68345* (2013.01); *H01L 2221/68359* (2013.01); *H01L 2924/1815* (2013.01); *H01L 2924/19042* (2013.01)

(58) Field of Classification Search
CPC ... H01L 23/5227; H01L 23/645; H01L 28/10; H01L 25/117; H01L 2225/06548; H01L 23/043; H01L 2225/1064; H01L 23/49534; H01L 23/49527; H01L 23/3735; H01L 23/485
See application file for complete search history.

(56) References Cited

U.S. PATENT DOCUMENTS

| | | | |
|---|---|---|---|
| 7,795,071 B2 | 9/2010 | Hwee-Seng Jimmy et al. | |
| 8,445,990 B2* | 5/2013 | Lin ........................ | H01L 24/19 257/531 |
| 2007/0029648 A1 | 2/2007 | Gerber et al. | |
| 2007/0114641 A1 | 5/2007 | Goh et al. | |
| 2009/0057822 A1 | 3/2009 | Wen et al. | |
| 2010/0059854 A1* | 3/2010 | Lin ........................ | H01L 25/16 257/528 |
| 2015/0162271 A1 | 6/2015 | Ye | |

* cited by examiner

*Primary Examiner* — Sonya D McCall Shepard
(74) *Attorney, Agent, or Firm* — Shumaker & Sieffert, P.A.

(57) ABSTRACT

In some examples, device includes an integrated circuit (IC) inside a first insulating layer, an inductor, and a second insulating layer arranged between the first insulating layer and the inductor. The first insulating layer shares an interface with the second insulating layer, and the inductor is attached to the second insulating layer. The device further includes a conductive path configured to conduct electricity between the IC and the inductor, wherein the conductive path is inside the second insulating layer.

20 Claims, 8 Drawing Sheets

US 9,911,720 B1

POWER SWITCH PACKAGING WITH PRE-FORMED ELECTRICAL CONNECTIONS FOR CONNECTING INDUCTOR TO ONE OR MORE TRANSISTORS

TECHNICAL FIELD

This disclosure relates to semiconductor packaging.

BACKGROUND

Surface-mount technology (SMT) is a production method for electronics that involves attaching components and devices on a printed circuit board (PCB). Components and devices may be soldered on the PCB to provide stability and electrical connections through the traces in the PCB.

SUMMARY

In some examples, this disclosure describes techniques for a device that includes an integrated circuit (IC) inside a first insulating layer, an inductor, and a second insulating layer arranged between the first insulating layer and the inductor. The first insulating layer shares an interface with the second insulating layer, and the inductor is attached to the second insulating layer. The device further includes a conductive path configured to conduct electricity between the IC and the inductor, wherein the conductive path is inside the second insulating layer.

In some examples, this disclosure describes a method including forming a second insulating layer, forming a conductive path inside the second insulating layer, and electrically connecting an IC to the conductive path, wherein the IC is outside of the second insulating layer. The method further includes forming a first insulating layer sharing an interface with the second insulating layer, wherein the IC is inside the first insulating layer, and electrically connecting an inductor to the conductive path in the second insulating layer.

In some examples, this disclosure describes a power converter that includes at least two transistors inside a first insulating layer, wherein each transistor of the at least two transistors includes a control terminal and at least two load terminals, a first load terminal of a first transistor is electrically coupled to an input node of the power converter, a second load terminal of a first transistor is electrically coupled to a switch node, and a first load terminal of a second transistor is electrically coupled to the switch node, a driver circuit configured to deliver signals to the control terminal of the first transistor and the control terminal of the second transistor. The power converter further includes an inductor electrically coupled to a conductive path and an output node of the power converter, and a second insulating layer arranged between the at least two transistors and the inductor, wherein the first insulating layer shares an interface with the second insulating layer. The power converter further includes the conductive path, wherein the conductive path is electrically coupled to the switch node, and the conductive path is inside the second insulating layer.

The details of one or more examples are set forth in the accompanying drawings and the description below. Other features, objects, and advantages will be apparent from the description and drawings, and from the claims.

DETAILED DESCRIPTION

A power converter may include two or more transistors and an inductor. Constructing the power converter on a printed circuit board (PCB) may include attaching an integrated circuit (IC), which contains the two or more transistors, to the PCB and attaching the inductor, as a module separate from the IC, to the PCB. In this configuration, the IC and the inductor may communicate through electrical traces in the PCB.

To shorten the connection between the IC and the inductor, the inductor may be stacked on top of the IC on the PCB. The IC may be inside a first insulating layer that interfaces with a second insulating layer situated between the inductor and the first insulating layer. The connection, or "conductive path," between the IC and the inductor may be inside the second insulating layer. By shortening the conductive path and isolating the conductive path from the PCB, the power converter may experience less noise and parasitic capacitance, as compared to attaching the IC and the inductor to the PCB as separate modules.

Figure 1:
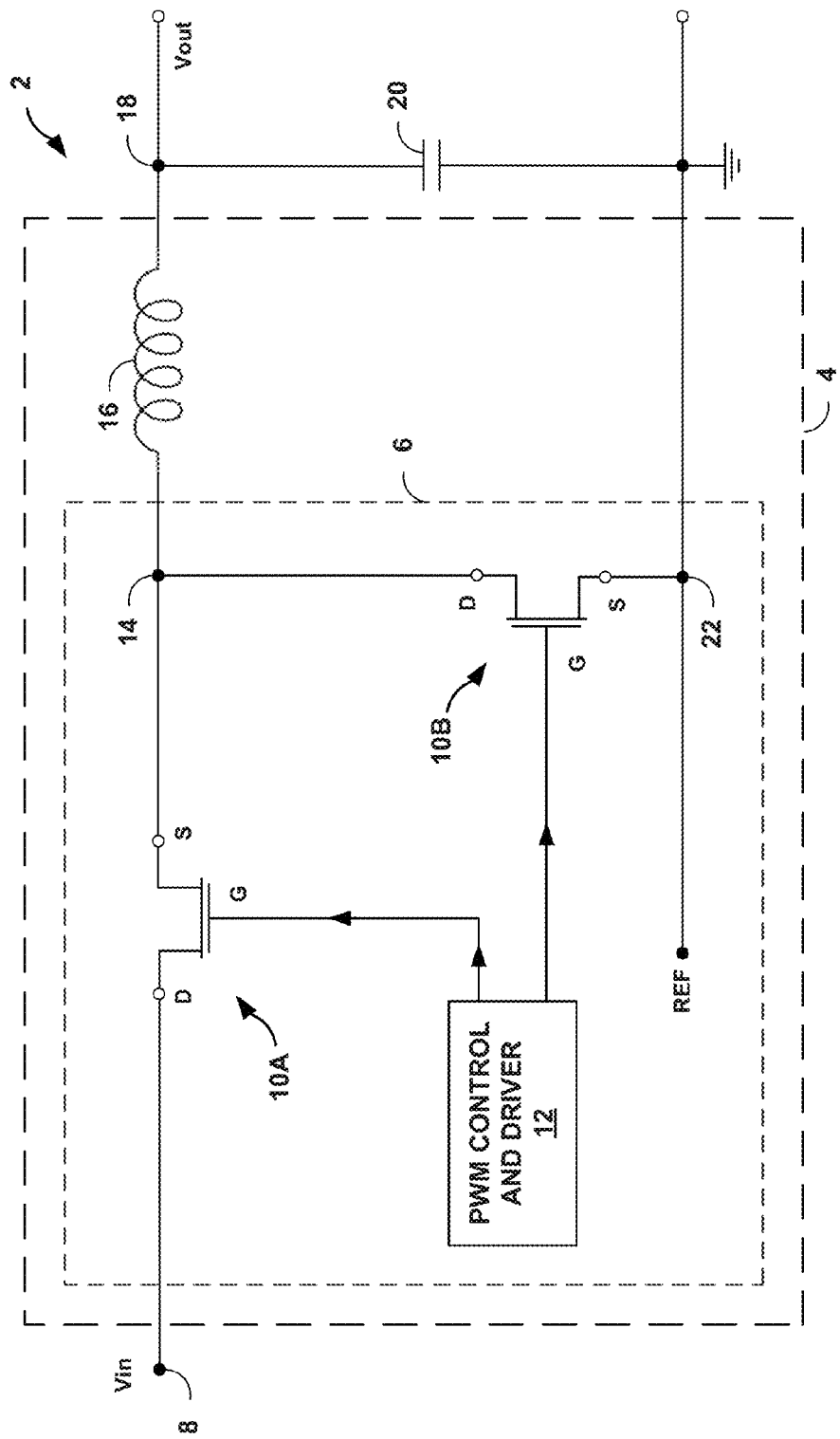
FIG. 1 is a circuit diagram for a power converter, in accordance with some examples of this disclosure.

FIG. 1 is a circuit diagram for a power converter 2, in accordance with some examples of this disclosure. In some examples, power converter 2 may comprise a half-bridge direct-current-to-direct-current (DC-to-DC) buck converter for converting an input DC signal to an output DC signal with a lower voltage. As a DC-to-DC buck converter, power converter 2 may operate as a voltage regulator in a variety of applications. However, the techniques of this disclosure may apply to other circuits and configurations, such as other power converters, including multi-phase power converters.

Power converter 2 may include device 4, which may include integrated circuit (IC) 6. Power converter 2 may include transistors 10A, 10B, inductor 16, capacitor 20, and pulse-width modulation (PWM) control and driver 12. In some examples, power converter 2 may contain more or fewer components than the components depicted in FIG. 1. Power converter 2 may include input node 8, output node 18, and reference node 22, as well as other nodes not shown in FIG. 1. Nodes 8, 18, 22 may be configured to connect to external components. For example, input node 8 may connect to an input voltage such as a power supply, output node 18 may connect to an electronic device, reference node 22 may connect to a reference voltage, such as reference ground. In some examples, PWM control and driver 12 may connect to an external circuit to a node (not shown in FIG. 1).

Transistors 10A, 10B may comprise metal-oxide semiconductor (MOS) field-effect transistors (FETs), bipolar junction transistors (BJTs), insulated-gate bipolar transistors (IGBTs), high-electron-mobility transistors (HEMTs), gallium-nitride (GaN) based transistors, and/or other elements that use voltage for control. Transistors 10A, 10B may comprise n-type transistors or p-type transistors, and transistors 10A, 10B may comprise vertical power transistors. For a vertical power transistor, the source terminal and the drain terminal may be on opposite sides or opposite surfaces of the transistor. Current in a vertical power transistor may flow through the transistor from top to bottom. In some examples, transistors 10A, 10B may comprise other analog devices such as diodes. Transistors 10A, 10B may also include freewheeling diodes connected in parallel with transistors to prevent reverse breakdown of transistors 10A, 10B. In some examples, transistors 10A, 10B may operate as switches or as analog devices. In still other examples, transistors 10 may include more than two transistors, such as in multi-phase power converters or other more complex power circuits. For example, in a multi-phase power converter, power converter 2 may have one high-side transistor and one low-side transistor for each phase. Therefore, a multi-phase power converter may include one or more replications of power converter 2 as depicted in FIG. 1.

FIG. 1 depicts transistors 10A, 10B with three terminals: drain (D), source (S), and gate (G). Current may flow between the drain and source of transistors 10A, 10B, based on the voltage at the gate. Current may flow from input node 8 to switch node 14, through the drain and source of transistor 10A, based on the voltage at the gate of transistor 10A. Current may flow from switch node 14 to reference node 22, through the drain and source of transistor 10B, based on the voltage at the gate of transistor 10B. Transistor 10A may comprise a high-side transistor, and transistor 10B may comprise a low-side transistor because transistor 10B is connected to reference node 22.

Transistors 10A, 10B may comprise various material compounds, such as silicon (Si), silicon carbide (SiC), Gallium Nitride (GaN), or any other combination of one or more semiconductor materials. To take advantage of higher power density requirements in some circuits, power converters may operate at higher frequencies. Improvements in magnetics and faster switching, such as Gallium Nitride (GaN) switches, may support higher frequency converters. These higher frequency circuits may require control signals to be sent with more precise timing than for lower frequency circuits.

PWM control and driver 12 may deliver signals and/or voltages to the control terminals of transistors 10A, 10B. FIG. 1 depicts PWM control and driver 12 as one component, but the PWM control circuit and the driver circuit may be separate components. In some examples, PWM control and driver 12, only the PWM control circuit, or only the driver circuit may be located outside of power converter 2 or outside of IC 6.

Inductor 16 may comprise a coil inductor that is outside of IC 6. Inductor 16 may connect to switch node 14 and output node 18. Inductor 16 may impede the flow of alternating-current (AC) electricity, while allowing DC electricity to flow between switch node 14 and output node 18.

Capacitor 20 may comprise a film capacitor, an electrolytic capacitor, a ceramic capacitor, or any other suitable type of capacitor or capacitors that is outside of IC 6 and device 4. Capacitor 20 may be an optional component in power converter 2. Capacitor 20 may connect to output node 18 and reference node 22. Capacitor 20 may impede the flow of DC electricity, while allowing AC electricity to flow between output node 18 and reference node 22. Capacitor 20 may act as a smoothing capacitor for the voltage at output node 18 to moderate fluctuations in the voltage at output node 18.

Figure 2:
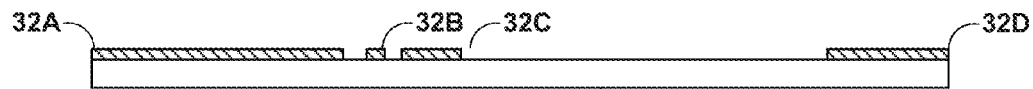
FIGS. 2-9 are cross-section diagrams of a fabrication process for a semiconductor package, in accordance with some examples of this disclosure.

FIGS. 2-9 are cross-section diagrams of a fabrication process for a semiconductor package, in accordance with some examples of this disclosure. FIG. 2 depicts a first stage of the fabrication process that may include carrier 30 and metal layers 32A-32D. Carrier 30 may act as a substrate or base that supports other components such as metal layers 32A-32D. Metal layers 32A-32D may be plated on carrier 30, and metal layers 32A-32D may be configured to conduct electricity. Metal layers 32A-32D may extend into or out of the page, and there may be more or fewer than four metal layers.

Figure 3:
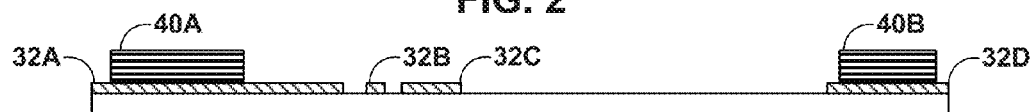

FIG. 3 depicts a second stage of the fabrication process that may include plating studs 40A, 40B on metal layers 32A, 32D using a photo-resist mask. Studs 40A and 40B may be configured to conduct electricity with metal layers 32A and 32D, respectively.

Figure 4:
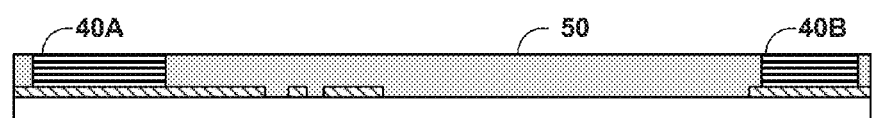

FIG. 4 depicts a third stage of the fabrication process that may include forming of molding compound 50 around metal layers 32A-32D and studs 40A, 40B. Molding compound may be deposited on carrier 30 and may form a layer around metal layers 32A-32D and studs 40A, 40B. Molding compound 50 may comprise a semi solid or a moldable solid that covers, forms around, and/or secures metal layers 32A-32D and studs 40A, 40B. Molding compound 50 may prevent or impede the conduction of electricity between stud 40A and stud 40B. Molding compound 50 may comprise any suitable insulating material, such as laminate substrate, prepreg, or epoxy molding compound, which is a silica- or aluminum-reinforced epoxy laminate material often used to manufacture PCBs. Epoxy molding compound may have a melting point for its first melt that is less than two hundred degrees Celsius, which may be lower than other materials, such as FR-4. Epoxy molding compound may be pliable at lower temperatures before and during the first melt. Epoxy molding compound may have a higher melting temperature after the first melt, making it resilient to heat after the manufacturing process is finished.

Together, studs 40 and metal layers 32 may comprise pre-formed electrically conductive paths through the insulating layer comprising molding compound 50. In some examples, the tops of studs 40A, 40B may be exposed after the formation of molding compound 50.

Figure 5:
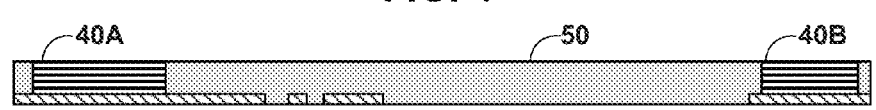

FIG. 5 depicts a fourth stage of the fabrication process that may include removing carrier 30 from molding compound 50 and metal layers 32A-32D. Molding compound 50 may hold metal layers 32A-32D and studs 40A, 40B together after the removal of carrier 30.

Metal layers 32, studs 40, and molding compound 50 may comprise a pre-fabricated layer. The conductive paths created by metal layers 32 and studs 40 may comprise pre-formed metal conductive paths or pillars. The conductive paths including metal layers 32 and studs 40 may in some cases have better current carrying characteristics than laser-drilled vias. Laser-drilled vias may have a conical shape with a smaller thickness at one end. Laser-drilled vias may perform worse at high switching speeds, as compared to pre-formed conductive paths. Pre-formed conductive paths may have more consistent size and shape, as compared to laser-drilled vias.

Figure 6:
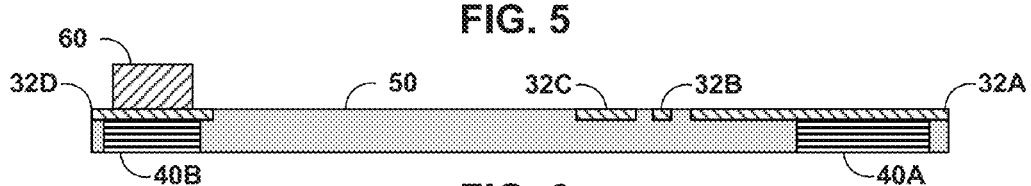

FIG. 6 depicts a fifth stage of the fabrication process that may include creating pad 60 using a metal plate and photoresist mask. Before creating pad 60, the device including molding compound 50, studs 40A, 40B, and metal layers 32A-32D may be flipped upside down, or "inverted," to expose metal layers 32A-32D on the topside of the device. Pad 60 may be created, or "plated," on the top of metal layer 32D and configured to conduct electricity with metal layer 32D and stud 40B.

Figure 7:
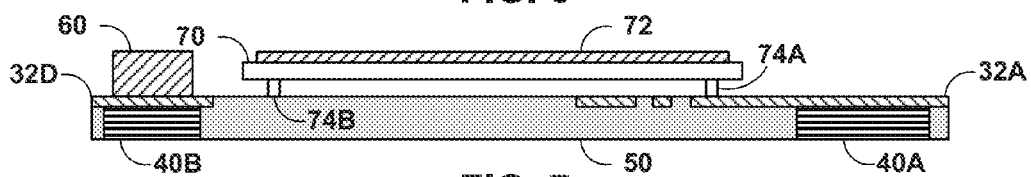

FIG. 7 depicts a sixth stage of the fabrication process that may include attaching IC 72 to molding compound 50 and metal layer 32A using connectors 74A, 74B. Connectors 74A, 74B may support IC 70 on molding compound 50. In some examples, connectors 74A, 74B may comprise solder bumps, solder balls, electrically conductive paste, or metal pillars that allow connector 74A to conduct electricity between IC 70 and metal layer 32A. Conductive pad 72 may be placed on top of IC 70. Although FIG. 7 depicts conductive pad 72 as extending across a majority of the top side of IC 70, conductive pad 72 may cover a larger or smaller portion of IC 70, or conductive pad 72 may comprise multiple conductive pads on top of IC 70. The backside of IC 70 may be pre-plated prior to the sixth stage to form conductive pad 72.

IC 70 may comprise a so-called "flip chip" and may contain two or more transistors that are configured to conduct electricity with conductive pad 72 and connectors 74A, 74B. The transistors in IC 70 may experience voltages from less than one volt up to two thousand volts and currents from less than one milliampere up to hundreds of amperes. IC 70 may contain a circuit that is similar to IC 4 in FIG. 1.

Figure 8:
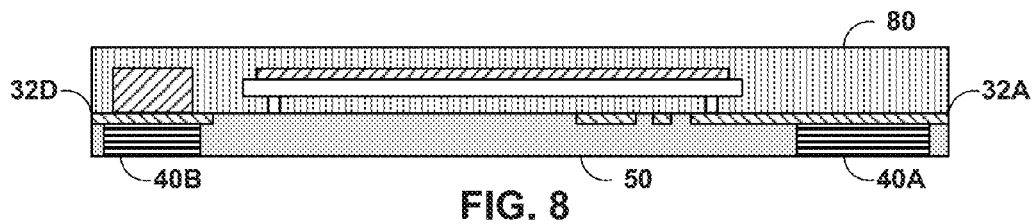

FIG. 8 depicts a seventh stage of the fabrication process that may include depositing molding compound 80, which may comprise a different material than molding compound 50. The deposition of molding compound 80 may be referred to as "over-molding." Molding compound 80 may be less viscous than molding compound 50 to allow molding compound 80 to flow into and fill the space underneath IC 70 to secure IC 70 and connectors 74A, 74B. The filler size or particle size in molding compound 80 may be small enough small enough to fit in the space between IC 70 and molding compound 50. In some examples, molding compound 80 may comprise encapsulating material or epoxy molding compound. In some examples, the fabrication process may include liquid underfill or anisotropic tape with conductive film for the space between IC 70 and molding compound 50.

Figure 9:
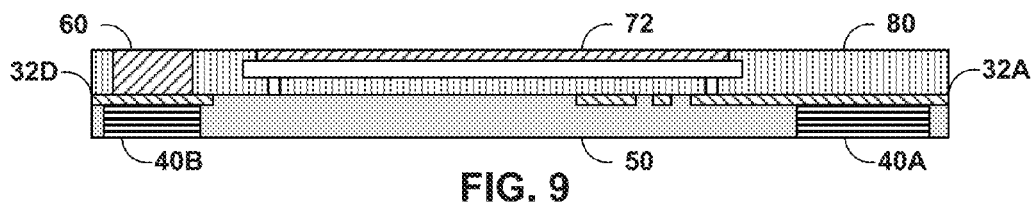
Figure 10:
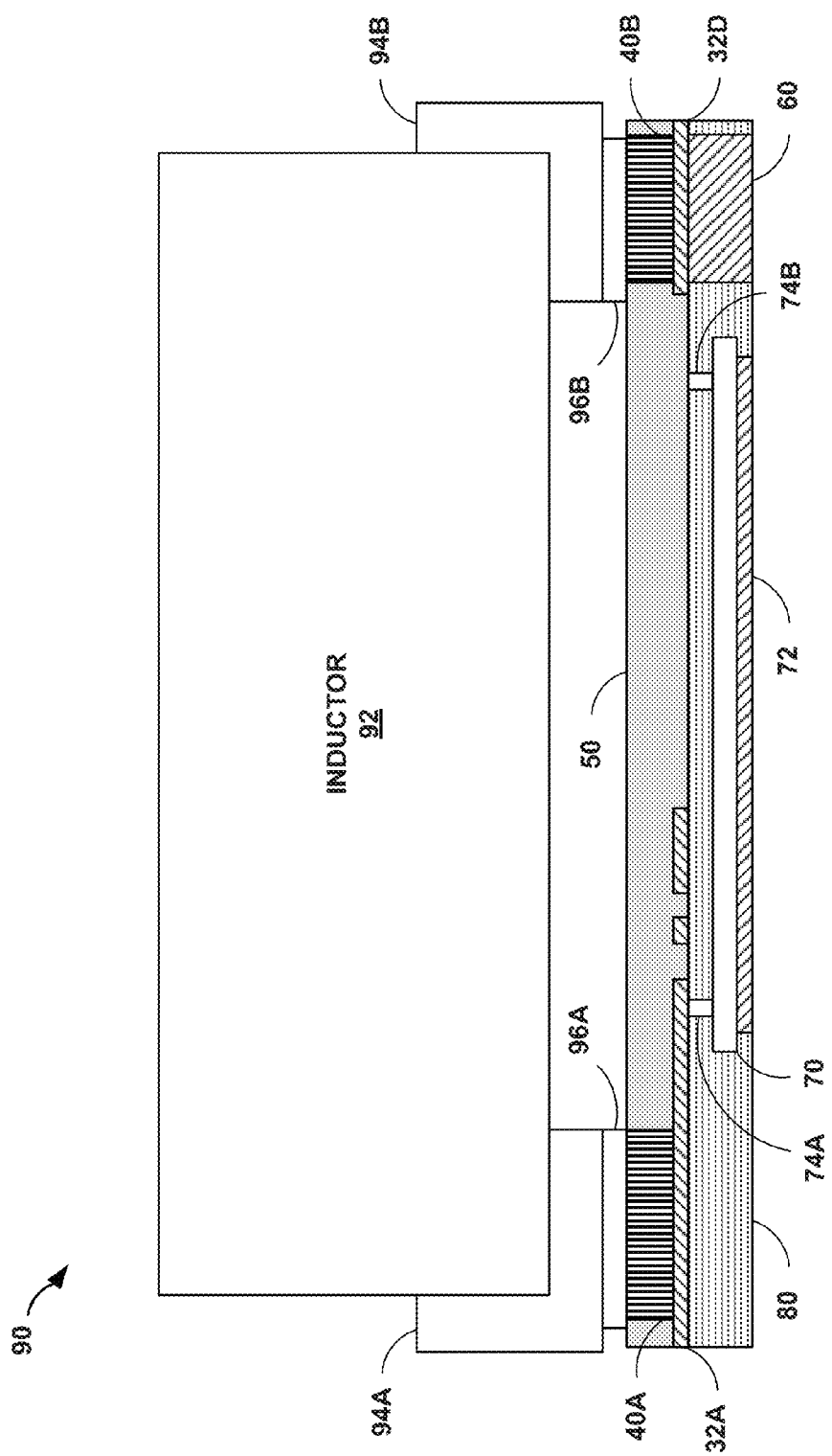
FIG. 10 is a cross-section diagram of a device with an inductor, in accordance with some examples of this disclosure.

FIG. 9 depicts an eighth stage of the fabrication process that may include grinding down molding compound 80 to expose conductive pad 72 on the backside of IC 70 and to expose pad 60. Molding compound 80 may comprise an insulating layer, so grinding down may allow pad 60 and conductive pad 72 to conduct electricity with other external components, as shown in FIG. 10. After grinding down, conductive pad 72 may be co-planar with pad 60 and molding compound 80. In some examples, conductive pad 72 may have a thickness of less than approximately one hundred and thirty micrometers.

FIG. 10 is a cross-section diagram of a device 90 with an inductor 92, in accordance with some examples of this disclosure. FIG. 10 also depicts a ninth stage of the fabrication process that may include inverting the device shown in FIG. 9 and attaching, or "surface mounting," inductor 92 to studs 40A, 40B and molding compound 50 to form device 90. Inductor 92 may comprise a coil inductor or any other suitable inductor. As depicted in FIG. 10, inductor 92 may have a significantly larger volume than IC 70. In some examples, inductor 92 may have a width and a length in the range of two to twenty millimeters, while IC 70 may have a width and a length in the range of two to ten millimeters. IC 70 and inductor 92 may have any other dimensions that are suitable for the techniques of this disclosure. Stacking inductor 92 on IC 70 may therefore save space on a PCB.

Inductor 92 may include leads 94A, 94B which may conduct electricity and support inductor 92. Leads 94A, 94B may attach to respective studs 40A, 40B by respective connectors 96A, 96B. Connectors 96A, 96B may comprise solder, electrically conductive paste or adhesive, or any other suitable material for securing leads 94A, 94B to respective studs 40A, 40B.

In accordance with the techniques of this disclosure, device 90 may comprise IC 70 inside a first insulating layer that includes molding compound 80. Device 90 may further comprise a second insulating layer that includes molding compound 50 arranged between the first insulating layer and inductor 92. The first insulating layer, which includes molding compound 80, may share an interface with the second insulating layer, to which inductor 92 may attach. Device 90 may further comprise a conductive path including metal layer 32A and stud 40A. The conductive path may be configured to conduct electricity between IC 70 and inductor 92 inside the second insulating layer that includes molding compound 50.

The conductive path may conduct electricity between IC 70 and inductor 92 through connector 74A, connector 96A, and lead 94A. The conductive path may include a metal pillar, such as a copper pillar, in the form of stud 40A through molding compound 50. Together, connector 74A, metal layer 32A, stud 40A, connector 96A, and lead 94A may comprise, or be electrically connected to, switch node 14 in FIG. 1. The conductive path may allow vertical current flow between IC 70 and inductor 92.

Device 90 may be mounted on a PCB (not shown in FIG. 10), such that molding compound 80, conductive pad 72, and pad 60 attach to the PCB. The conductive path may not conduct electricity with the traces in the PCB because molding compound 80 may act as an insulating layer. By isolating the conductive path from the PCB, device 90 may experience less noise and a shorter connection, as compared to forming a conductive path from IC 70 through a trace in the PCB to a conductive path through both insulating layers comprising molding compounds 50, 80. The conductive path may be shorter than a path through the trace(s) in the PCB, and this shorter path may reduce parasitic capacitances and parasitic inductances in device 90. The conductive path may also improve switching times.

In some examples, IC 70 may comprise two or more transistors, each transistor with two load terminals and one gate terminal. One or more of the transistors may comprise a vertical transistor with a first load terminal connected to a top side of IC 70, such as connector 74A or 74B, and a second load terminal connected to a bottom side of IC 70, such as conductive pad 72. One or more of the transistors may comprise a lateral transistor with both load terminals connected to the same side of IC 70. IC 70 may also have electrical connections to reference voltage and an input node. As shown in FIG. 10, conductive pad 72 may offer an electrical connection to reference voltage through a trace in a PCB, and connector 74B may offer an electrical connection to an input node, either into or out of the page in FIG. 10.

Figure 11:
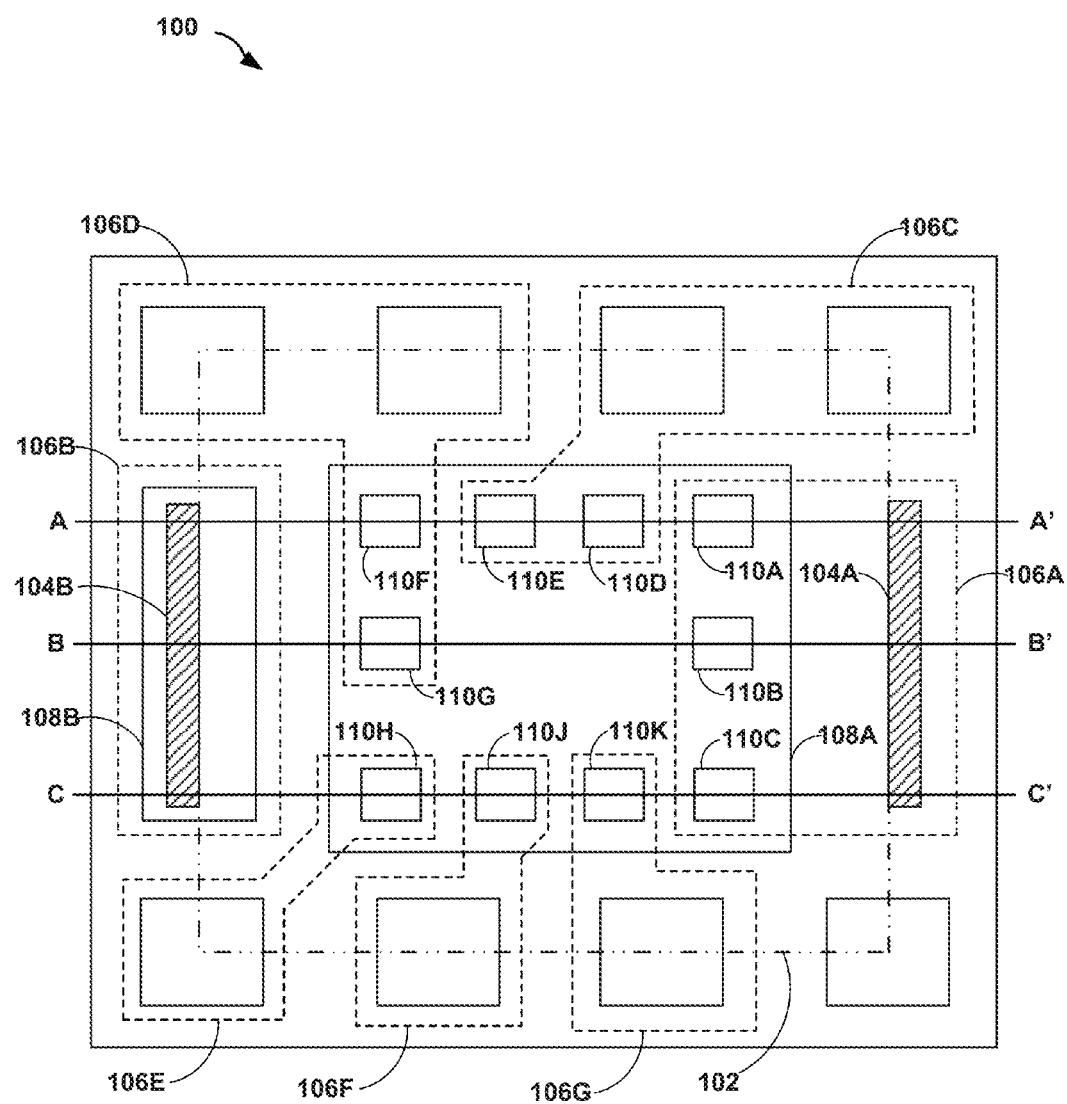
FIG. 11 is a top-view diagram of a device with an inductor, in accordance with some examples of this disclosure.

FIG. 11 is a top-view diagram of a device 100 with an inductor 102, in accordance with some examples of this disclosure. Inductor 102 may the top level of device 100, and leads 104A, 104B may be underneath and to the side of inductor 102. Leads 104A, 104B may be configured to conduct electricity between inductor 102 and the lower levels of device 100. Lines A-A', B-B', and C-C' may be cross sections of device 100 that correspond to FIGS. 12-14, respectively.

Lead 104A may conduct electricity between inductor 102 and metal layer 106A, which may conduct electricity with IC 108A. Metal layer 106A may connect to connections 110A-110C on IC 108A. Metal layer 106A may be similar to switch node 14 and/or metal layer 32A in FIG. 10. Through connections 110A-110C on IC 108A, metal layer 106A may conduct electricity with one or more transistors in IC 108A. Metal layer 106A and lead 104A may not conduct electricity with the bottom of device 100, which may be attached to a PCB.

Lead 104B may conduct electricity between inductor 102 and metal layer 106B, which may conduct electricity with pad 108B. Pad 108B may conduct electricity with the bottom of device 100, which may be attached to a PCB. Lead 104B, metal layer 106B, and pad 108B may be similar in operation to output node 18 in FIG. 1 and lead 94B, connector 96B, stud 40B, metal layer 32D, and pad 60 in FIG. 10. Metal layer 106B may not directly conduct electricity with IC 108A. Pad 108B may comprise a plated pillar through insulating layer 112.

Metal layers 106C-106G may conduct electricity with connections 110D-110K on IC 108A. One or more of connections 110D-110K may correspond to reference node 22 in FIG. 1. One or more of connections 110D-110K may connect to a power supply for a PWM controller or a driver circuit inside IC 108A. In some examples, one or more of connections 110D-110K may connect to a PWM controller or a driver circuit that is external to IC 108A. In some examples, IC 108A may have more or fewer than ten connections 110, and device 100 may have more or fewer than seven metal layers 106.

Figure 12:
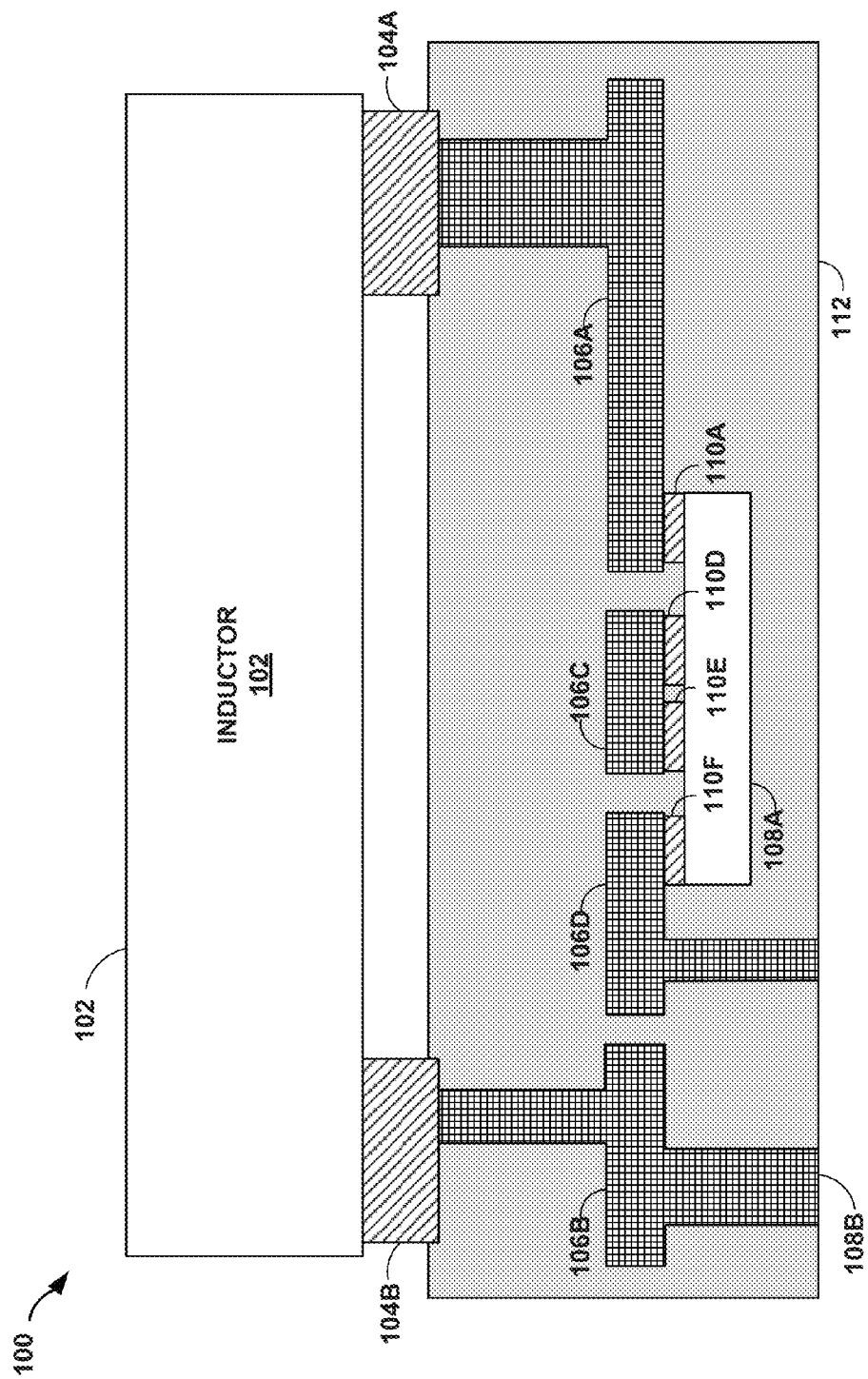
FIG. 12 is a cross-section diagram of a device with an inductor corresponding to line A-A' in FIG. 11, in accordance with some examples of this disclosure.

FIG. 12 is a cross-section diagram of a device 100 with an inductor 102 corresponding to line A-A' in FIG. 11, in accordance with some examples of this disclosure. Device 100 may contain all of metal layers 106A-106G and connections 110A-110K as shown in FIG. 11, but FIG. 12 may not depict some of metal layers 106 and some of connections 110. Some of metal layers 106 and connections 110 may be into or out of the page, such that some of metal layers 106 and connections 110 may not intersect line A-A'.

IC 108A may include vertical transistors or lateral transistors. Vertical transistors may conduct current between the top and bottom of IC 108A. As shown in FIG. 12, the top surface of IC 108A may have connections, such that the transistors inside IC 108A may comprise lateral transistors.

Connections 110 are depicted in FIG. 12 as round, but connections 110 may be any suitable shape for connecting and conducting electricity between metal layers 106 and IC 108A. In some examples, IC 108A may comprise a leadless IC, such as a power quad flat no-lead (PQFN) package, so that metal layers 106 may rest directly on electrical contacts on IC 108A. Connections 110 may also comprise solder bumps or metal pillars, such as copper pillars.

Insulator 112 is depicted as a single layer but may comprise two or more layers, as shown in FIG. 10. Insulator 112 may comprise any suitable insulating material, including pre-impregnated composite fibers (prepreg), laminate substrate, or resin-type material.

Figure 13:
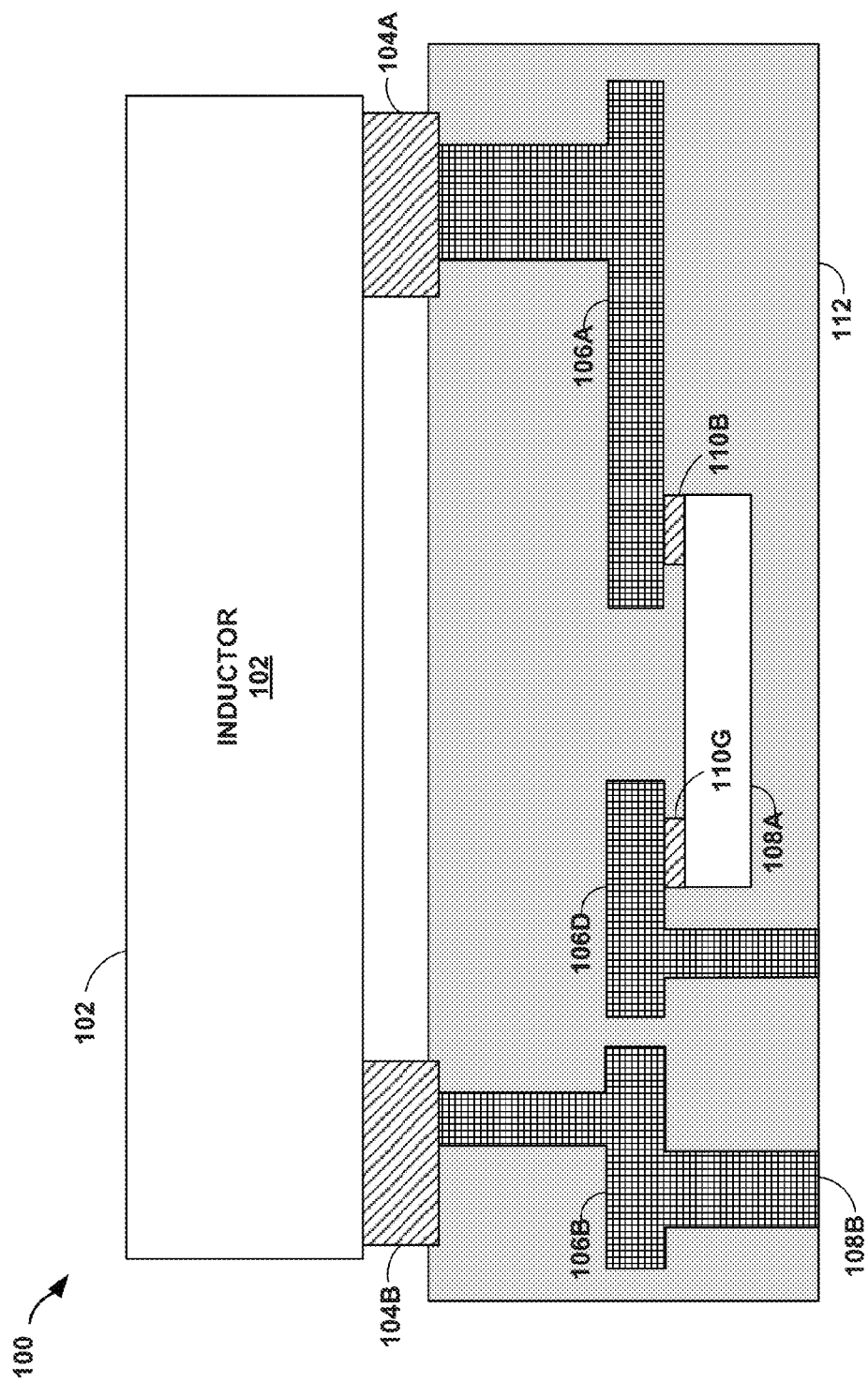
FIG. 13 is a cross-section diagram of a device with an inductor corresponding to line B-B' in FIG. 11, in accordance with some examples of this disclosure.

FIG. 13 is a cross-section diagram of a device 100 with an inductor 102 corresponding to line B-B' in FIG. 11, in accordance with some examples of this disclosure. Device 100 may contain all of metal layers 106A-106G and connections 110A-110K as shown in FIG. 11, but FIG. 13 may not depict some of metal layers 106 and some of connections 110. Some of metal layers 106 and connections 110 may be into or out of the page, such that some of metal layers 106 and connections 110 may not intersect line B-B'.

Figure 14:
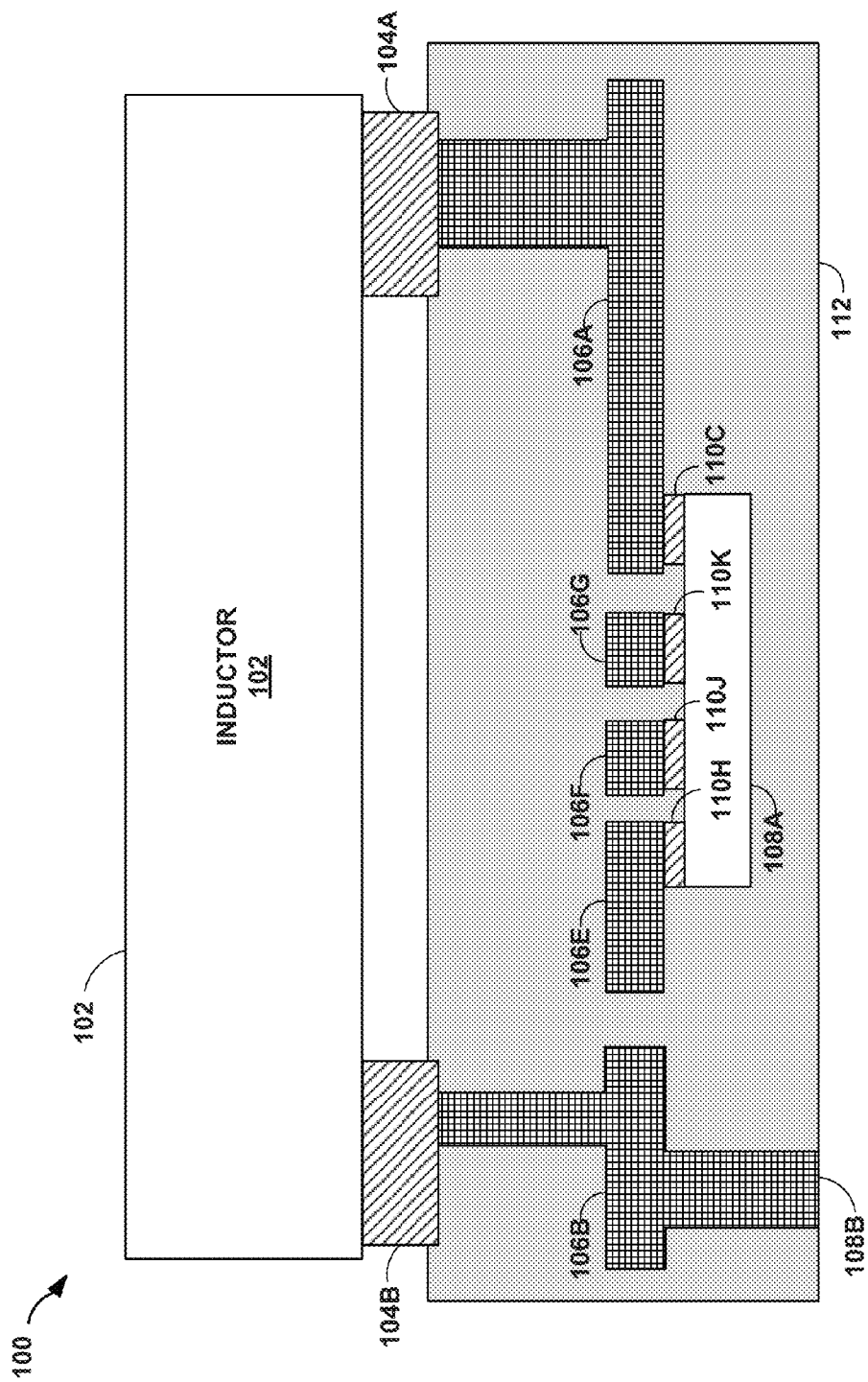
FIG. 14 is a cross-section diagram of a device with an inductor corresponding to line C-C' in FIG. 11, in accordance with some examples of this disclosure.

FIG. 14 is a cross-section diagram of a device 100 with an inductor 102 corresponding to line C-C' in FIG. 11, in accordance with some examples of this disclosure. Device 100 may contain all of metal layers 106A-106G and connections 110A-110K as shown in FIG. 11, but FIG. 14 may not depict some of metal layers 106 and some of connections 110. Some of metal layers 106 and connections 110 may be into or out of the page, such that some of metal layers 106 and connections 110 may not intersect line C-C'.

Metal layers 106E-106G may connect to other components or nodes into or out of the page in FIG. 14. These components or nodes may include an input node, such as input node 8 in FIG. 1, a PWM control circuit, a driver circuit, or a power supply for PWM control circuit or a driver circuit inside IC 108A.

Figure 15:
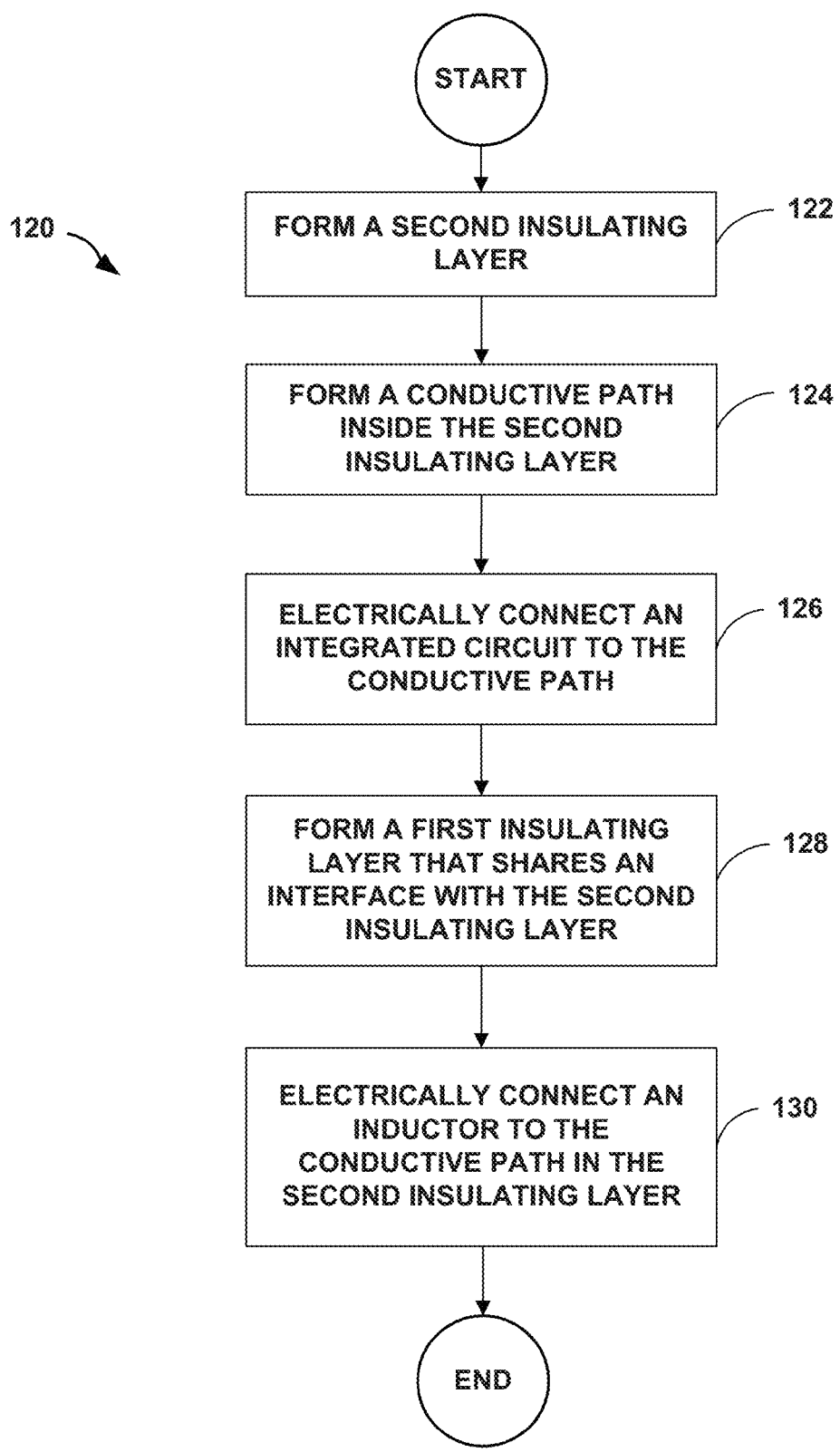
FIG. 15 is a flowchart illustrating an example technique for fabricating a device including an integrated circuit, in accordance with some examples of this disclosure.

FIG. 15 is a flowchart illustrating an example technique 120 for fabricating a device including an IC, in accordance with some examples of this disclosure. Technique 120 is described with reference to device 90 in FIG. 10, although other components, such as device 100 in FIGS. 11-14, may exemplify similar techniques.

The technique of FIG. 15 includes forming a second insulating layer (122). The second insulating layer may comprise molding compound 50, which may comprise prepreg or a laminate substrate.

The technique of FIG. 15 further includes forming a conductive path inside the second insulating layer (124). The conductive path may include metal layer 32A and stud 40A. The conductive path may be formed before the second insulating layer is formed around the conductive path.

The technique of FIG. 15 further includes electrically connecting IC 70 to the conductive path (126). The second insulating layer may be flipped over, and IC 70 may be placed on connector 74A on the second insulating layer. Connector 74A, which may comprise a solder bump, may act as an electrical connection between IC 70 and the conductive path.

The technique of FIG. 15 further includes forming a first insulating layer that shares an interface with the second insulating layer (128). The first insulating layer may comprise molding compound 80, which may comprise a viscous liquid or semi-liquid that hardens around IC 70.

The technique of FIG. 15 further includes electrically connecting inductor 92 to the conductive path in the second insulating layer (130). Inductor 92 may include one or more leads 94. Lead 94A may connect to the conductive path by connector 96A.

The following numbered examples demonstrate one or more aspects of the disclosure.

Example 1

A device includes an IC inside a first insulating layer, an inductor, and a second insulating layer arranged between the first insulating layer and the inductor. The first insulating layer shares an interface with the second insulating layer, and the inductor is attached to the second insulating layer. The device further includes a conductive path configured to conduct electricity between the IC and the inductor, wherein the conductive path is inside the second insulating layer.

Example 2

The device of example 1, wherein the IC comprises at least two transistors, an electrical connection to a reference voltage, an electrical connection to an input node, and an electrical connection to the conductive path.

Example 3

The device of any combination of examples 1-2, wherein each transistor of the at least two transistors includes a control terminal and two load terminals. One transistor of the at least two transistors is a vertical transistor that includes at least one load terminal that is electrically connected to a top side of the IC and at least one load terminal that is electrically connected to a bottom side of the IC.

Example 4

The device of any combination of examples 1-3, wherein each transistor of the at least two transistors comprises a lateral transistor that includes at least two load terminals that are electrically connected to a top side of the IC or a bottom side of the IC.

Example 5

The device of any combination of examples 1-4, wherein the IC comprises a driver circuit configured to deliver signals to the control terminal of each transistor of the at least two transistors.

Example 6

The device of any combination of examples 1-5, wherein the first transistor comprises an n-type field effect transistor (FET), and the second transistor comprises an n-type FET. A first load terminal of a first transistor of the at least two transistors is coupled to the input node, and a second load terminal of the first transistor is coupled to the conductive path and to a first load terminal of a second transistor of the at least two transistors. A second load terminal of the second transistor is coupled to the reference voltage.

Example 7

The device of any combination of examples 1-6, wherein the first insulating layer comprises an encapsulating material surrounding the IC, and the conductive path does not extend into the encapsulating material.

Example 8

The device of any combination of examples 1-7, wherein the conductive path is coupled to the IC by a solder ball, electrically conductive paste, or a copper pillar.

Example 9

The device of any combination of examples 1-8, wherein the IC, the conductive path, and the inductor comprise a power converter.

Example 10

The device of any combination of examples 1-9, wherein the conductive path comprises a pre-formed copper pillar through the second insulating layer; and the conductive path does not extend into the first insulating layer.

Example 11

A method includes forming a second insulating layer, forming a conductive path inside the second insulating layer, and electrically connecting an IC to the conductive path, wherein the IC is outside of the second insulating layer. The method further includes forming a first insulating layer sharing an interface with the second insulating layer, wherein the IC is inside the first insulating layer, and electrically connecting an inductor to the conductive path in the second insulating layer.

Example 12

The method of example 11, further comprising electrically connecting the IC to a reference voltage and electrically connecting the IC to an input node, wherein the IC comprises at least two transistors.

Example 13

The method of any combination of examples 11-12, wherein each transistor of the at least two transistors includes a control terminal and two load terminals. One transistor of the at least two transistors comprises a vertical transistor, wherein the vertical transistor includes at least one load terminal that is electrically connected to a top side of the IC and at least one load terminal that is electrically connected to a bottom side of the IC.

Example 14

The method of any combination of examples 11-13, wherein each transistor of the at least two transistors comprises a lateral transistor, and each transistor of the at least two transistors includes at least two load terminals that are electrically connected to a top side of the IC or a bottom side of the IC.

Example 15

The method of any combination of examples 11-14, wherein the first transistor comprises an n-type FET, and the second transistor comprises an n-type FET. A first load terminal of a first transistor of the at least two transistors is coupled to the input node, a second load terminal of the first transistor is coupled to the conductive path and to a first load terminal of a second transistor of the at least two transistors, and a second load terminal of the second transistor is coupled to the reference voltage.

Example 16

The method of any combination of examples 11-15, wherein electrically connecting the IC to the conductive path comprises: depositing solder on a conductive bump on the interface; and attaching the IC to the solder by melting the solder.

Example 17

The method of any combination of examples 11-16, wherein forming the conductive path occurs before forming the conductive path inside the second insulating layer. The method further includes forming a second metal pillar before forming the second insulating layer, wherein the second metal pillar is inside the second insulating layer, and flipping the second insulating layer before electrically connecting the IC to the conductive path. The method further includes forming a first metal pillar before forming the first insulating layer, wherein the first metal pillar is inside the first insulating layer, and grinding down the first insulating layer to expose the first metal pillar before electrically connecting the inductor to the conductive path in the second insulating layer.

Example 18

A power converter includes at least two transistors inside a first insulating layer, wherein each transistor of the at least two transistors includes a control terminal and at least two load terminals, a first load terminal of a first transistor is electrically coupled to an input node of the power converter, a second load terminal of a first transistor is electrically coupled to a switch node, and a first load terminal of a second transistor is electrically coupled to the switch node, a driver circuit configured to deliver signals to the control terminal of the first transistor and the control terminal of the second transistor. The power converter further includes an inductor electrically coupled to a conductive path and an output node of the power converter, and a second insulating layer arranged between the at least two transistors and the inductor, wherein the first insulating layer shares an interface with the second insulating layer. The power converter further includes the conductive path, wherein the conductive path is electrically coupled to the switch node, and the conductive path is inside the second insulating layer.

Example 19

The power converter of example 19, wherein the first transistor comprises a vertical n-type FET, and the second transistor comprises a vertical n-type FET.

Example 20

The power converter of any combination of examples 19-20, further comprising an encapsulating material surrounding the at least two transistors, wherein the conductive path does not extend into the encapsulating material.

Various examples of the disclosure have been described. Any combination of the described systems, operations, or functions is contemplated. These and other examples are within the scope of the following claims.

What is claimed is:
1. A device comprising:
a conductive path;
an integrated circuit (IC) inside a first insulating layer, wherein the IC includes:
a first electrical connection to a reference voltage,
a second electrical connection to an input node, and
a third electrical connection to the conductive path;
an inductor;
a second insulating layer arranged between the first insulating layer and the inductor, wherein:
the first insulating layer shares an interface with the second insulating layer,
the inductor is attached to the second insulating layer,
the conductive path is configured to conduct electricity between the IC and the inductor, and
the conductive path is inside the second insulating layer.
2. The device of claim 1, wherein the IC comprises at least two transistors.
3. The device of claim 2, wherein:
each transistor of the at least two transistors includes a control terminal and two load terminals; and
one transistor of the at least two transistors comprises a vertical transistor, wherein the vertical transistor includes at least one load terminal that is electrically connected to a top side of the IC and at least one load terminal that is electrically connected to a bottom side of the IC.
4. The device of claim 2, wherein:
each transistor of the at least two transistors comprises a lateral transistor; and
each transistor of the at least two transistors includes at least two load terminals that are electrically connected to a top side of the IC or a bottom side of the IC.
5. The device of claim 2, wherein the IC comprises a driver circuit configured to deliver signals to the control terminal of each transistor of the at least two transistors.
6. The device of claim 3, wherein:
the first transistor comprises an n-type field effect transistor (FET);
the second transistor comprises an n-type FET;
a first load terminal of a first transistor of the at least two transistors is coupled to the input node;
a second load terminal of the first transistor is coupled to the conductive path and to a first load terminal of a second transistor of the at least two transistors; and
a second load terminal of the second transistor is coupled to the reference voltage.
7. The device of claim 1, wherein the first insulating layer comprises an encapsulating material surrounding the IC, wherein the conductive path does not extend into the encapsulating material.
8. The device of claim 1, wherein the conductive path is coupled to the IC by a solder ball, electrically conductive paste, or a copper pillar.
9. The device of claim 1, wherein the IC, the conductive path, and the inductor comprise a power converter.
10. The device of claim 1, wherein:
the conductive path comprises a pre-formed copper pillar through the second insulating layer; and
the conductive path does not extend into the first insulating layer.
11. A method comprising:
forming a second insulating layer;
forming a conductive path inside the second insulating layer;
electrically connecting an integrated circuit (IC) to the conductive path, wherein the IC is outside of the second insulating layer;
forming a first insulating layer sharing an interface with the second insulating layer, wherein the IC is inside the first insulating layer;
electrically connecting an inductor to the conductive path in the second insulating layer;
electrically connecting the IC to a reference voltage; and
electrically connecting the IC to an input node.
12. The method of claim 11, wherein:
each transistor of the at least two transistors includes a control terminal and two load terminals;
one transistor of the at least two transistors comprises a vertical transistor, wherein the vertical transistor includes at least one load terminal that is electrically connected to a top side of the IC and at least one load terminal that is electrically connected to a bottom side of the IC.
13. The method of claim 11, wherein:
each transistor of the at least two transistors comprises a lateral transistor; and each transistor of the at least two transistors includes at least two load terminals that are electrically connected to a top side of the IC or a bottom side of the IC.

14. The method of claim 12, wherein:
the first transistor comprises an n-type field effect transistor (FET);
the second transistor comprises an n-type FET;
a first load terminal of a first transistor of the at least two transistors is coupled to the input node;
a second load terminal of the first transistor is coupled to the conductive path and to a first load terminal of a second transistor of the at least two transistors; and
a second load terminal of the second transistor is coupled to the reference voltage.

15. The method of claim 11, wherein electrically connecting the IC to the conductive path comprises:
depositing solder on a conductive bump on the interface; and
attaching the IC to the solder by melting the solder.

16. The method of claim 11, wherein forming the conductive path occurs before forming the conductive path inside the second insulating layer, the method further comprising:
forming a second metal pillar before forming the second insulating layer, wherein the second metal pillar is inside the second insulating layer;
flipping the second insulating layer before electrically connecting the IC to the conductive path;
forming a first metal pillar before forming the first insulating layer, wherein the first metal pillar is inside the first insulating layer; and
grinding down the first insulating layer to expose the first metal pillar before electrically connecting the inductor to the conductive path in the second insulating layer.

17. A power converter comprising:
at least two transistors inside a first insulating layer, wherein:
each transistor of the at least two transistors includes a control terminal and at least two load terminals,
a first load terminal of a first transistor is electrically coupled to an input node of the power converter,
a second load terminal of a first transistor is electrically coupled to a switch node, and
a first load terminal of a second transistor is electrically coupled to the switch node,
a driver circuit configured to deliver signals to the control terminal of the first transistor and the control terminal of the second transistor;
an inductor electrically coupled to a conductive path and an output node of the power converter;
a second insulating layer arranged between the at least two transistors and the inductor, wherein the first insulating layer shares an interface with the second insulating layer; and
the conductive path, wherein:
the conductive path is electrically coupled to the switch node, and
the conductive path is inside the second insulating layer.

18. The power converter of claim 17, wherein:
the first transistor comprises a vertical n-type field-effect transistor (FET); and
the second transistor comprises a vertical n-type FET.

19. The power converter of claim 17, further comprising an encapsulating material surrounding the at least two transistors, wherein the conductive path does not extend into the encapsulating material.

20. The power converter of claim 17, wherein:
the conductive path comprises a pre-formed copper pillar through the second insulating layer; and
the conductive path does not extend into the first insulating layer.

* * * * *